(12) United States Patent
Yamagiwa et al.

(10) Patent No.: US 8,497,553 B2
(45) Date of Patent: Jul. 30, 2013

(54) SEMICONDUCTOR DEVICE

(75) Inventors: Hiroto Yamagiwa, Hyogo (JP); Shingo Hashizume, Kyoto (JP); Ayanori Ikoshi, Kyoto (JP); Manabu Yanagihara, Osaka (JP); Yasuhiro Uemoto, Toyama (JP)

(73) Assignee: Panasonic Corporation, Osaka (JP)

( * ) Notice: Subject to any disclaimer, the term of this patent is extended or adjusted under 35 U.S.C. 154(b) by 201 days.

(21) Appl. No.: 12/905,801

(22) Filed: Oct. 15, 2010

(65) Prior Publication Data

US 2011/0193171 A1   Aug. 11, 2011

(30) Foreign Application Priority Data

Feb. 5, 2010  (JP) ................................. 2010-024231

(51) Int. Cl.
*H01L 23/62* (2006.01)
*H01L 29/66* (2006.01)
*H01L 31/06* (2006.01)
*H01L 21/338* (2006.01)
*H02H 3/00* (2006.01)
*H02H 9/02* (2006.01)

(52) U.S. Cl.
USPC ........... 257/355; 257/192; 257/196; 257/201; 438/172; 438/573

(58) Field of Classification Search
USPC .......... 438/167–185, 570–583; 257/183–201, 257/355–363; 361/88–92
See application file for complete search history.

(56) References Cited

U.S. PATENT DOCUMENTS

| | | | | |
|---|---|---|---|---|
| 5,684,322 A | * | 11/1997 | Bernier | 257/355 |
| 7,550,781 B2 | * | 6/2009 | Kinzer et al. | 257/183 |
| 2002/0012212 A1 | * | 1/2002 | Yasumori | 361/56 |
| 2005/0116253 A1 | * | 6/2005 | Yamane et al. | 257/194 |
| 2005/0189584 A1 | * | 9/2005 | Matsuda | 257/330 |
| 2007/0023779 A1 | | 2/2007 | Hirose et al. | |
| 2009/0309137 A1 | * | 12/2009 | Miller | 257/213 |

FOREIGN PATENT DOCUMENTS

JP   2007-059882   3/2007

* cited by examiner

*Primary Examiner* — Fernando L. Toledo
*Assistant Examiner* — Karen Kusumakar
(74) *Attorney, Agent, or Firm* — McDermott Will & Emery LLP

(57) ABSTRACT

A semiconductor device includes a first transistor formed on a first element region, and a first protecting element including a second transistor formed on a second element region. A second protecting element ohmic electrode is connected to a first gate electrode, a first protecting element ohmic electrode is connected to a first ohmic electrode, and a first protecting element gate electrode is connected to at least one of the first protecting element ohmic electrode and the second protecting element ohmic electrode. The second element region is smaller in area than the first element region.

18 Claims, 19 Drawing Sheets

SEMICONDUCTOR DEVICE

CROSS-REFERENCE TO RELATED APPLICATION

This application claims priority to Japanese Patent Application No. 2010-024231 filed on Feb. 5, 2010, the disclosure of which including the specification, the drawings, and the claims is hereby incorporated by reference in its entirety.

BACKGROUND

The present disclosure relates to semiconductor devices, and more particularly to semiconductor devices using nitride semiconductors and including a protecting element.

Nitride semiconductors are compound semiconductors that are formed by compounds of aluminum (Al), boron (B), gallium (Ga), or indium (In) as a group III element and nitrogen (N) as a group V element, and is represented by the general formula $B_w Al_x Ga_y In_z N$ (where $w+x+y+z=1$, and $0 \leq w, x, y, z \leq 1$).

Nitride semiconductors have advantages such as a high breakdown voltage, a high electron saturation velocity, high electron mobility, and a high electron density in a hetero junction, due to their wide bandgaps. Nitride semiconductors having different bandgaps are obtained by changing the composition ratio of the group III elements. Hetero junction structures in which layers of nitride semiconductors having different bandgaps are laminated together, or quantum well structures or superlattice structures in which a plurality of such hetero junction structures are laminated together are capable of controlling the degree of modulation of the electron density in elements. Thus, applications of such structures to short wavelength light-emitting elements, high power high frequency elements, and high frequency low noise amplifying elements have been studied and developed.

One type of semiconductor elements using a heterojunction structure is a heterojunction field effect transistor (HFET). HFETs are elements that operate at a high speed, and are expected to be applied to high power elements, power switching elements, high frequency power devices, high frequency low noise amplifiers, and the like.

Reduction in size is desired for semiconductor devices, and HFETs for use in such applications are no exception. However, regarding HFETs using nitride semiconductors, reduction in size of control electrodes (gate electrodes) is limited due to the surge breakdown voltage of the control electrodes. In particular, a further increase in surge resistance is required for power switching elements and the like.

One known method for increasing the surge resistance of an HFET using nitride semiconductors is to connect a protecting diode to a control electrode thereof. Using a pn junction diode, which is formed on the same substrate as the HFET, as such a protecting diode is also considered to reduce the size of semiconductor devices (see, e.g., Japanese Published Patent Application No. 2007-59882).

SUMMARY

However, such conventional semiconductor devices having a protecting diode have the following problems. A protecting diode capable of passing a current of about several hundreds of milliamperes to one ampere is required to sufficiently protect a control electrode of an HFET from surges. Forming a pn junction diode having such high current capability requires a large element area, which prevents reduction in size of semiconductor devices. Moreover, forming a pn junction diode having high current capability also requires additional steps in the manufacturing process of the semiconductor devices.

It is an object of the present disclosure to solve the above problems, and to implement a semiconductor device having high surge resistance while reducing the area of a protecting element and without complicating the manufacturing process.

In order to achieve the object, a semiconductor device of the present disclosure is configured to use as a protecting element a transistor having a channel as a two-dimensional electron gas layer.

Specifically, an example semiconductor device includes: a first transistor having a first ohmic electrode, a first gate electrode, and a second ohmic electrode, which are formed on a first element region in a semiconductor stack; and a first protecting element that is formed on the semiconductor stack, is connected between the first gate electrode and the first ohmic electrode, and establishes a current path that passes a current therethrough when an overvoltage is applied to the first gate electrode. The first protecting element includes a second transistor that is formed on a second element region isolated from the first element region in the semiconductor stack. The second transistor has a first protecting element ohmic electrode, a first protecting element gate electrode, and a second protecting element ohmic electrode, which are formed on the second element region. The second protecting element ohmic electrode is connected to the first gate electrode. The first protecting element ohmic electrode is connected to the first ohmic electrode. The first protecting element gate electrode is connected to at least one of the first protecting element ohmic electrode and the second protecting element ohmic electrode. The semiconductor stack has a first semiconductor layer and a second semiconductor layer, which are sequentially formed on a substrate, and the second semiconductor layer has a wider bandgap than that of the first semiconductor layer. The second element region is smaller in area than the first element region.

If an overvoltage is applied to the first gate electrode in the example semiconductor device, the second transistor is turned on, whereby a current path that passes a current therethrough can be established. Since the current flows in a two-dimensional electron gas layer as a channel of the second transistor, a large current can be passed through the second transistor even if the second transistor has a small size. Moreover, the second transistor can be formed in the same process as that of the first transistor. This enables a semiconductor device having high surge resistance to be implemented while reducing the area of the protecting element and without complicating the manufacturing process.

DETAILED DESCRIPTION

First Embodiment

Figure 1:
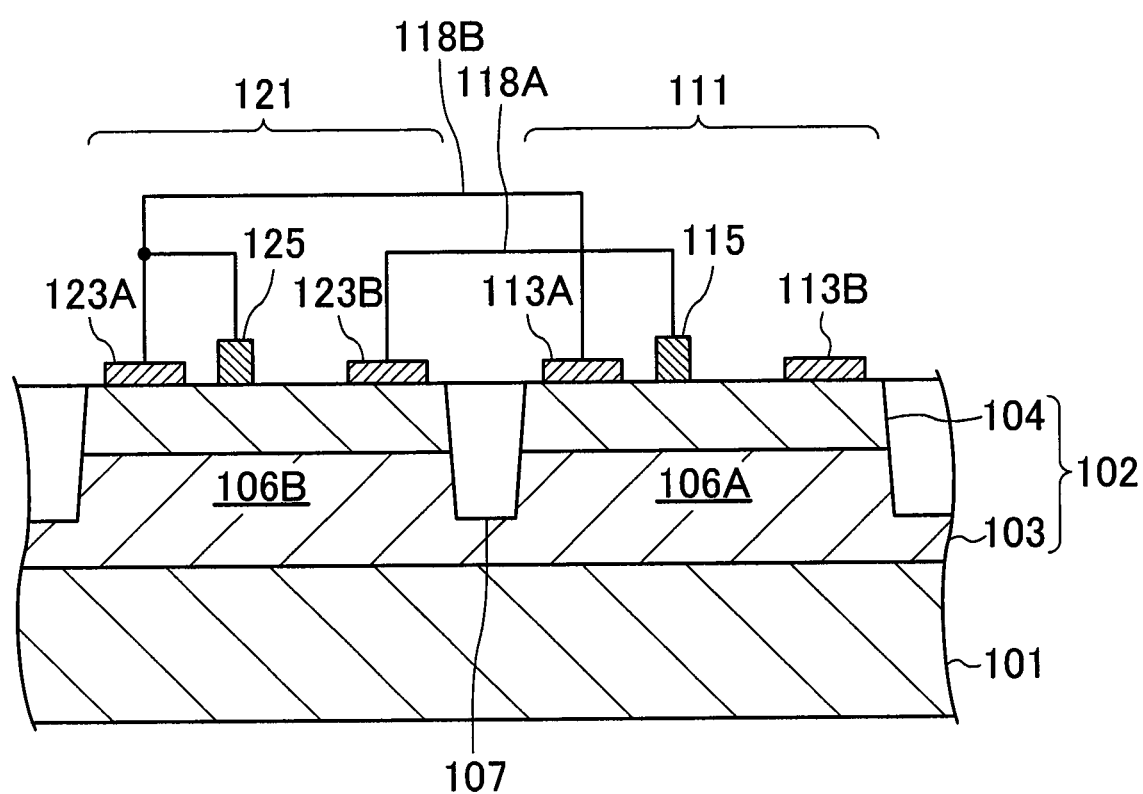
FIG. 1 is a cross-sectional view of a semiconductor device according to a first embodiment.

A first embodiment will be described below with reference to the accompanying drawings. FIG. 1 shows a cross-sectional configuration of a semiconductor device of the first embodiment. As shown in FIG. 1, a semiconductor stack 102 is formed on a substrate 101 such as a silicon substrate. The semiconductor stack 102 has a first semiconductor layer 103, and a second semiconductor layer 104 having a wider bandgap than that of the first semiconductor layer 103. A high density two-dimensional electron gas (2DEG) layer is formed near the interface of the first semiconductor layer 103 with the second semiconductor layer 104. The first semiconductor layer 103 can be, e.g., a gallium nitride (GaN) layer having a thickness of 1 μm, and the second semiconductor layer 104 can be, e.g., an aluminum gallium nitride (AlGaN) layer having a thickness of 25 nm.

The semiconductor stack 102 has a first element region 106A and a second element region 106B, which are surrounded by an element isolation region 107. The element isolation region 107 can be formed by implanting ions such as boron or iron into the semiconductor stack 102, and is a region having higher resistance than that of the remaining part of the semiconductor stack 102. Thus, the 2DEG layer in the first element region 106A is independent of the 2DEG layer in the second element region 106B.

A first ohmic electrode 113A and a second ohmic electrode 113B are formed on the first element region 106A so as to be separated from each other. A gate electrode 115 is formed between the first and second ohmic electrodes 113A, 113B. Thus, a first transistor 111 is formed as an HFET having the 2DEG layer as a channel. Note that each of the first and second ohmic electrodes 113A, 113B need only form an ohmic junction with the 2DEG layer, and may be formed in a recess.

A first protecting element ohmic electrode 123A and a second protecting element ohmic electrode 123B are formed on the second element region 106B so as to be separated from each other. A protecting element gate electrode 125 is formed between the first and second protecting element ohmic electrodes 123A, 123B. Thus, a second transistor 121 is formed as an HFET having the 2DEG layer as a channel. Note that each of the first and second protecting element ohmic electrodes 123A, 123B need only form an ohmic junction with the 2DEG layer, and may be formed in a recess.

The second transistor 121 is connected between the gate electrode 115 and the first ohmic electrode 113A of the first transistor 111. Specifically, the second protecting element ohmic electrode 123B is connected to the gate electrode 115 via a conductive interconnect 118A, and the first protecting element ohmic electrode 123A and the protecting element gate electrode 125 are connected to the first ohmic electrode 113A via a conductive interconnect 118B.

Figure 2:
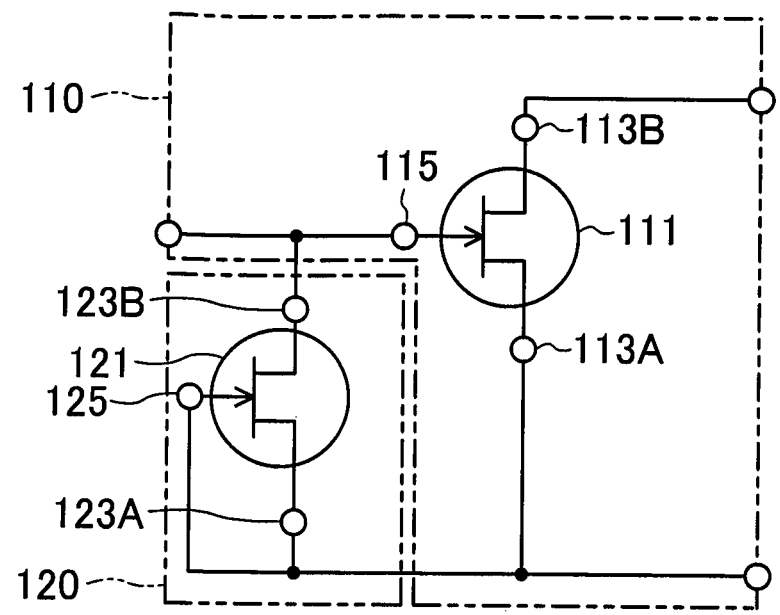
FIG. 2 is an equivalent circuit diagram of the semiconductor device of the first embodiment.

The operation of the semiconductor device of the present embodiment will be described below. FIG. 2 shows an equivalent circuit of the semiconductor device of the present embodiment. The second transistor 121 as a protecting element 120 is connected between the gate electrode 115 and the first ohmic electrode 113A of the first transistor 111 as a protected element 110. The second protecting element ohmic electrode 123B of the second transistor 121 is connected to the gate electrode 115 of the first transistor 111, and the first protecting element ohmic electrode 123A and the protecting element gate electrode 125 of the second transistor 121 are connected to the first ohmic electrode 113A of the first transistor 111.

The first transistor 111 is a normally off transistor in which a current flows between the first ohmic electrode 113A and the second ohmic electrode 113B when a positive voltage Vth1 is applied to the gate electrode 115. The second transistor 121 is a normally off transistor in which a current flows between the first protecting element ohmic electrode 123A and the second protecting element ohmic electrode 123B when a positive voltage Vth2 is applied to the protecting element gate electrode 125.

Figure 3:
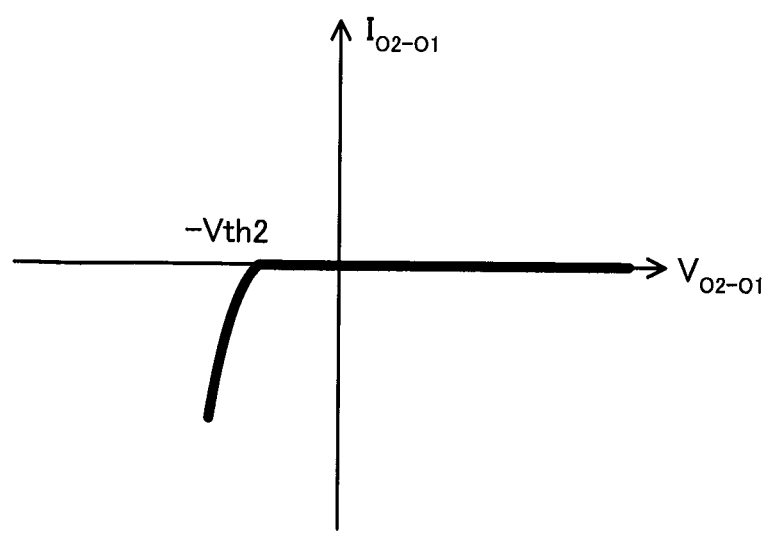
FIG. 3 is a graph showing voltage-current characteristics of a protecting element according to the first embodiment.

As shown in FIG. 2, since the protecting element gate electrode 125 of the second transistor 121 is directly connected to the first protecting element ohmic electrode 123A, the potential of the protecting element gate electrode 125 is equal to that of the first protecting element ohmic electrode 123A. Thus, a voltage $V_{O2-O1}$ that is applied between the second protecting element ohmic electrode 123B and the first protecting element ohmic electrode 123A, and a current $I_{O2-O1}$ that flows therebetween have a relation shown in FIG. 3. When the voltage $V_{O2-O1}$ is positive, no current flows between the second protecting element ohmic electrode 123B and the first protecting element ohmic electrode 123A. When the voltage $V_{O2-O1}$ reaches $-Vth2$, the channel of the second transistor 121 becomes conductive. Thus, a current flows from the first protecting element ohmic electrode 123A toward the second protecting element ohmic electrode 123B.

Thus, in the semiconductor device of the present embodiment, the second transistor 121 as the protecting element 120 is turned on when a negative surge, which has a larger absolute value than that of a threshold voltage Vth2 of the second transistor 121, is applied to the gate electrode 115 of the first transistor 111. This establishes a current path that passes a current from the gate electrode 115 to the first ohmic electrode 113A, whereby the negative surge applied to the gate electrode 115 can be passed to the ground. For example, if Vth1 and Vth2 are 1.5 V and a negative surge lower than −1.5 V is applied to the gate electrode 115, the protecting element 120 is turned on to protect the first transistor 111. If a voltage higher than −1.5 V is applied to the gate electrode 115, the protecting element 120 remains off. Thus, if a voltage lower than Vth1 and higher than −Vth2, e.g., a voltage of 0 V, is applied to the gate electrode 115 to turn off the first transistor 111, the protecting element 120 is not turned on in normal operation, and thus the protecting element 120 does not affect the operation of the first transistor 111.

A current path between the first protecting element ohmic electrode 123A and the second protecting element ohmic electrode 123B of the second transistor 121 is the channel as the 2DEG layer. Thus, the second transistor 121 is capable of passing a much larger current therethrough as compared to a pn junction diode that passes a current via a pn junction. If the length of the electrodes of the pn junction diode is equal to that of the electrodes of the HFET, the HEFT can pass a current that is about 1,000 times that of the pn junction diode. Thus, sufficient current capability can be achieved even if the second transistor 121 as a protecting element is much smaller than the first transistor 111. Accordingly, the size of the semiconductor device can be reduced as compared to the case where a pn junction diode is formed as a protecting element.

In the present embodiment, the first transistor 111 as a protected element and the second transistor 121 as a protecting element are formed over the substrate 101. Since the first transistor 111 and the second transistor 121 are formed by the same process, the present embodiment is advantageous in that a semiconductor device having a protecting element can be formed with little change to the normal manufacturing process of semiconductor devices.

In FIG. 2, the protecting element gate electrode 125 and the first protecting element ohmic electrode 123A of the second transistor 121 are directly connected together, so that the potential of the protecting element gate electrode 125 is equal to that of the first protecting element ohmic electrode 123A. However, the potential of the protecting element gate electrode 125 need only be substantially equal to that of the first protecting element ohmic electrode 123A, and the protecting element gate electrode 125 and the first protecting element ohmic electrode 123A may be connected together via a resistor or the like.

Figure 4:
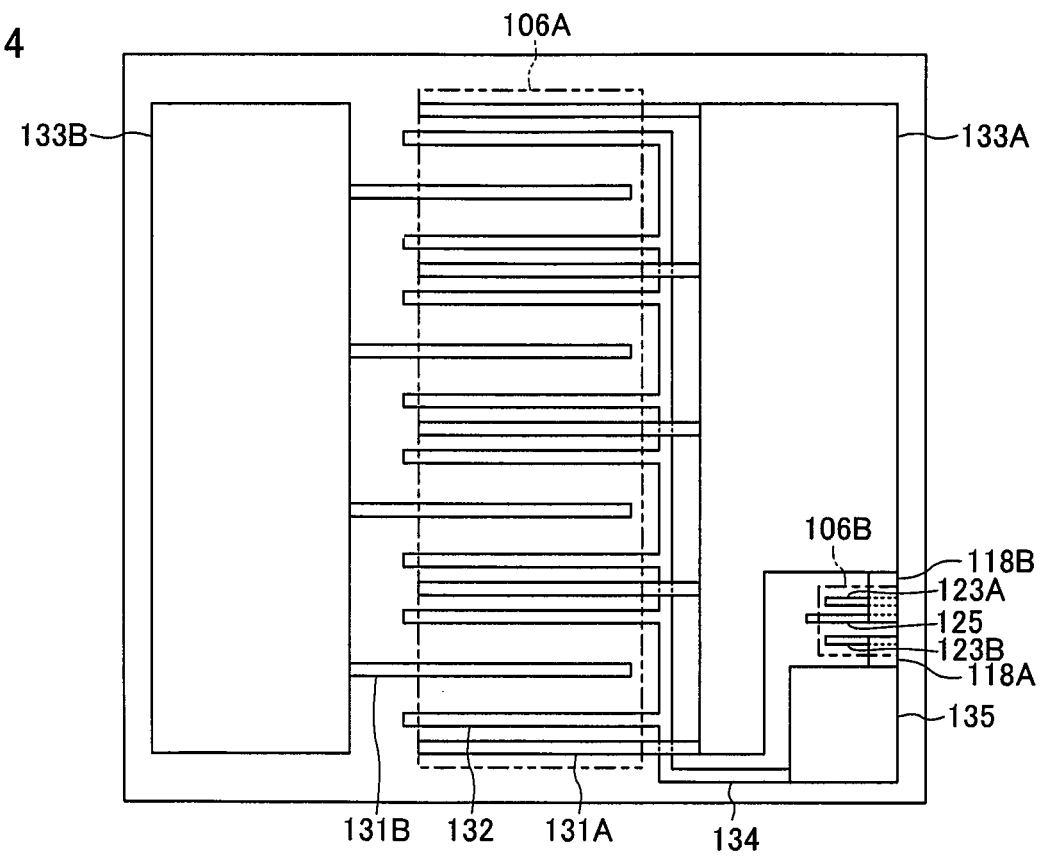
FIG. 4 is a plan view showing an example of the layout of the semiconductor device of the first embodiment.

FIG. 4 shows an example of the layout in the case where the first transistor 111 is a multi-finger HFET. The first ohmic electrode of the first transistor 111 has a plurality of first ohmic electrode fingers 131A, the second ohmic electrode of the first transistor 111 has a plurality of second ohmic electrode fingers 131B, and the gate electrode of the first transistor 111 has a plurality of gate electrode fingers 132. The first ohmic electrode fingers 131A and the second ohmic electrode fingers 131B are alternately arranged on the first element region 106A, and each gate electrode finger 132 is positioned between a corresponding pair of the first ohmic electrode finger 131A and the second ohmic electrode finger 131B. The first ohmic electrode fingers 131A are connected to a first ohmic electrode pad 133A, and the second ohmic electrode fingers 131B are connected to a second ohmic electrode pad 133B. The gate electrode fingers 132 are connected to a gate electrode pad 135 via a gate interconnect 134.

The second element region 106B, which is smaller than the first element region 106A, is formed between the first ohmic electrode pad 133A and the gate electrode pad 135 in the semiconductor stack 102. The first protecting element ohmic electrode 123A, the protecting element gate electrode 125, and the second protecting element ohmic electrode 123B are formed on the second element region 106B. The second protecting element ohmic electrode 123B is connected to the gate electrode pad 135 via a conductive interconnect 118A, and the first protecting element ohmic electrode 123A and the protecting element gate electrode 125 are connected to the second ohmic electrode pad 133B via a conductive interconnect 118B.

This configuration enables a compact protected element and a compact protecting element to be formed. Although the area of the second element region 106B can be determined according to required current capability, about one tenth to one fiftieth of the area of the first element region 106A is enough in typical applications.

Figure 5:
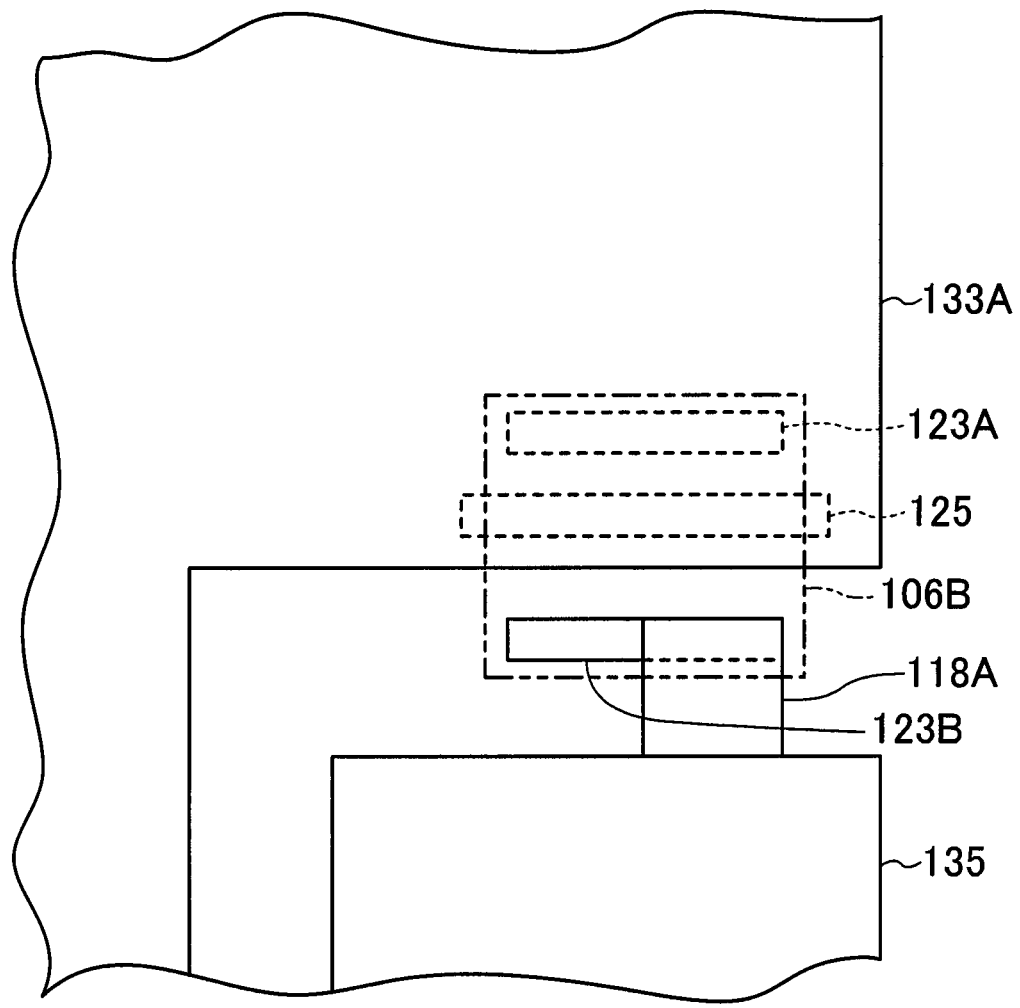
FIG. 5 is a plan view showing an example of the layout of the semiconductor device of the first embodiment.

As shown in FIG. 5, the first ohmic electrode pad 133A may be configured to partially cover the second element region 106B. This can further reduce the size of the semiconductor device. Moreover, the second ohmic electrode pad 133A may be formed on the first element region 106A. This can further reduce the size of the semiconductor device.

Figure 6:
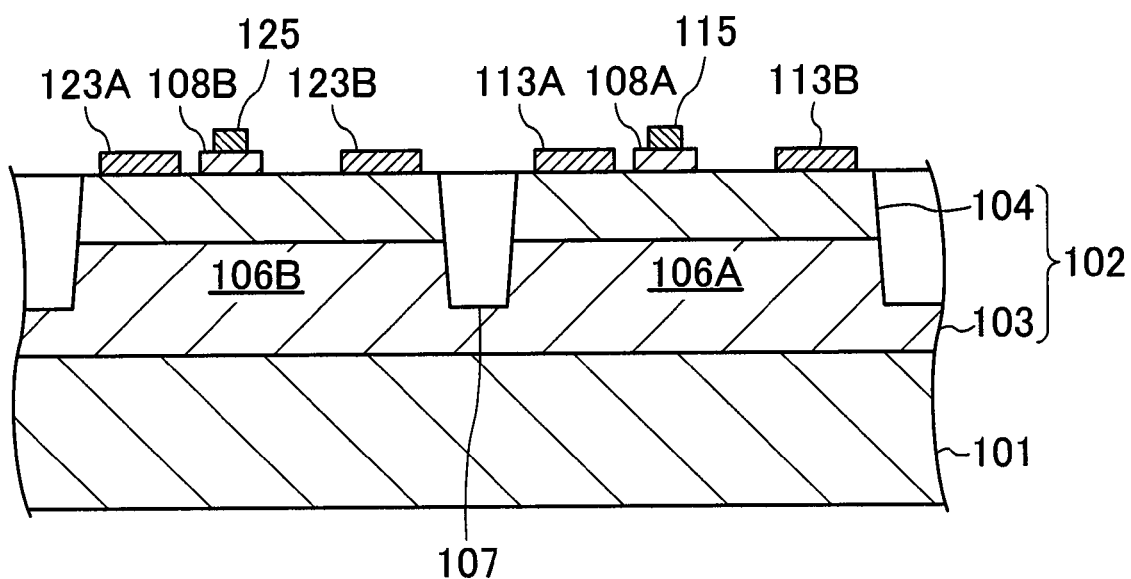
FIG. 6 is a cross-sectional view showing a modification of the semiconductor device of the first embodiment.
Figure 7:
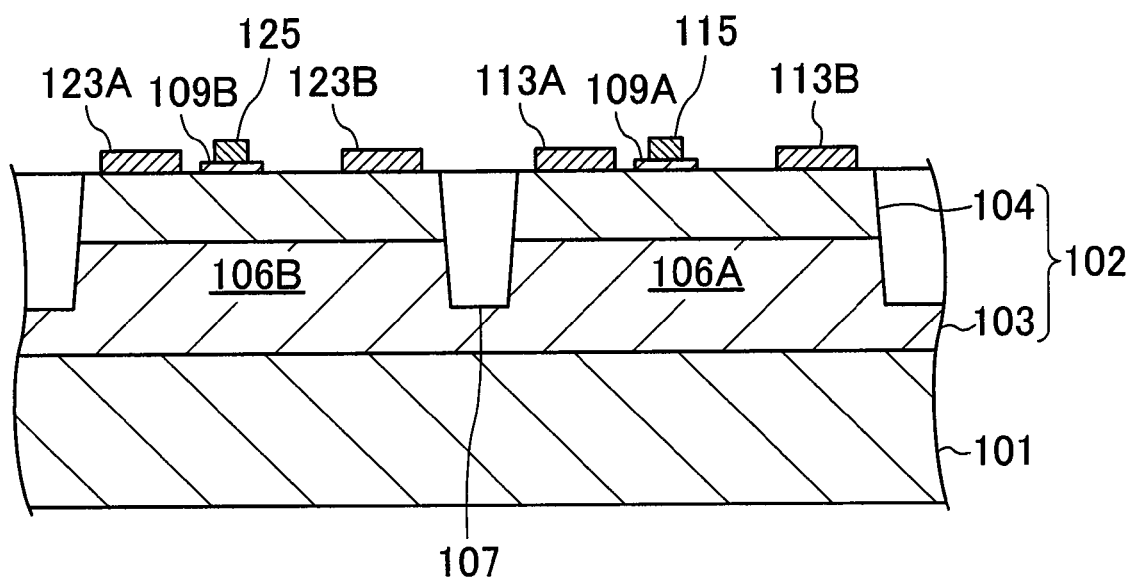
FIG. 7 is a cross-sectional view showing a modification of the semiconductor device of the first embodiment.

In the present embodiment, it is preferable that the first transistor 111 and the second transistor 121 be normally off transistors having a threshold voltage of 0 V or higher. The normally off first and second transistors 111, 121 can be implemented by adjusting the thickness of the second semiconductor layer 104 and/or forming the gate electrode 115 and the protecting element gate electrode 125 in gate recesses. As shown in FIG. 6, the gate electrode 115 may be formed on the first element region 106A with a p-type semiconductor layer 108A interposed therebetween, and the protecting element gate electrode 125 may be formed on the second element region 106B with a p-type semiconductor layer 108B interposed therebetween. The p-type semiconductor layers 108A, 108B are made of p-type GaN or the like. Alternatively, as shown in FIG. 7, the gate electrode 115 may be formed on the first element region 106A with a gate insulating film 109A interposed therebetween, and the protecting element gate electrode 125 may be formed on the second element region 106B with a gate insulating film 109B interposed therebetween.

In the semiconductor device of the present embodiment, the threshold voltage Vth1 of the first transistor 111 may be either equal to or different from the threshold voltage Vth2 of the second transistor 121. For example, in some cases, the first transistor 111, even if it is a normally off transistor, is turned off by applying a negative voltage to the gate electrode 115 in view of the effects of noise and the like. In this case, it is preferable to increase the threshold voltage Vth2 of the second transistor 121 to increase the difference between the voltage that turns on the second transistor 121 and the voltage that is applied to the gate electrode 115 to turn off the first transistor 111.

Figure 8:
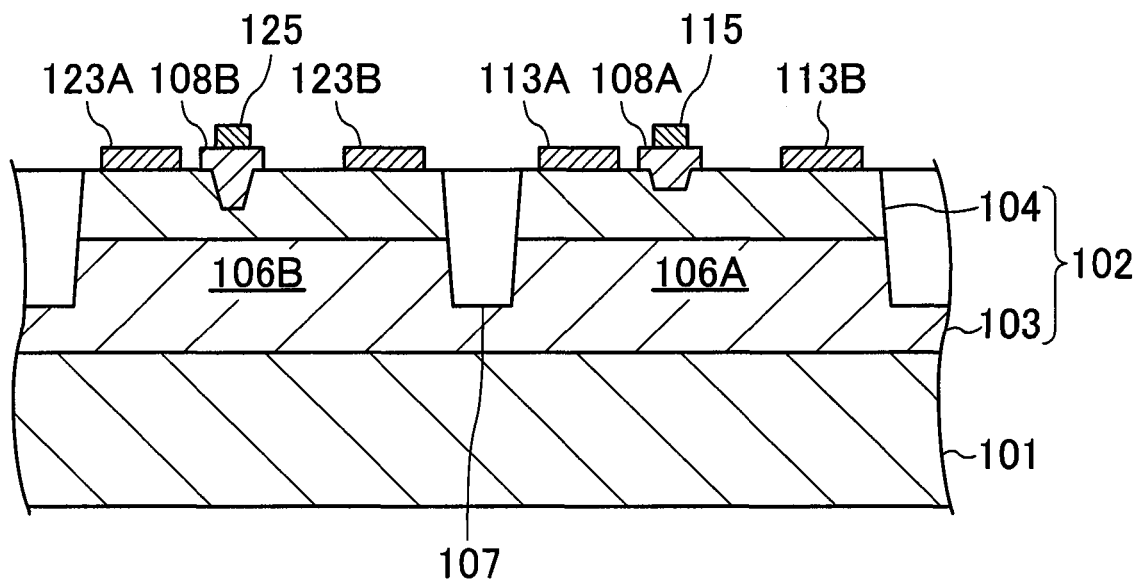
FIG. 8 is a cross-sectional view showing a modification of the semiconductor device of the first embodiment.
Figure 9:
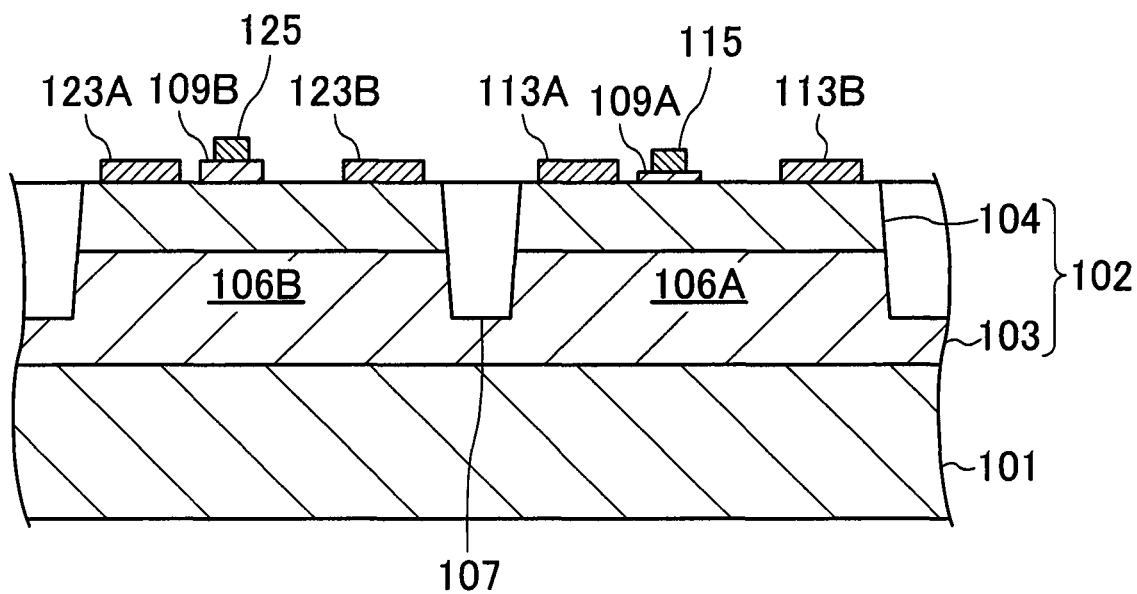
FIG. 9 is a cross-sectional view showing a modification of the semiconductor device of the first embodiment.

The threshold voltage Vth1 of the first transistor 111 can be made different from the threshold voltage Vth2 of the second transistor 121 in the following manner. In the case where the gate electrode is formed on the p-type semiconductor layer, the threshold voltage increases as the thickness of the p-type semiconductor layer increases and the gap between the p-type semiconductor layer and the 2DEG layer decreases. Thus, as shown in FIG. 8, forming the p-type semiconductor layer 108B in a deeper gate recess than the p-type semiconductor layer 108A can make the threshold voltage Vth2 of the second transistor 121 higher than the threshold voltage Vth1 of the first transistor 111. The threshold voltage increases as the thickness of the gate insulating film increases. Thus, as shown in FIG. 9, forming the gate insulating film 109B thicker than the gate insulating film 109A can make the threshold voltage Vth2 of the second transistor 121 higher than the threshold voltage Vth1 of the first transistor 111.

The first transistor 111 may be a normally on transistor whose threshold voltage Vth1 is lower than 0 V. In this case as well, the threshold voltage Vth2 of the second transistor 121 is made higher than an absolute value of a negative voltage that is applied to turn off the first transistor 111.

Figure 10:
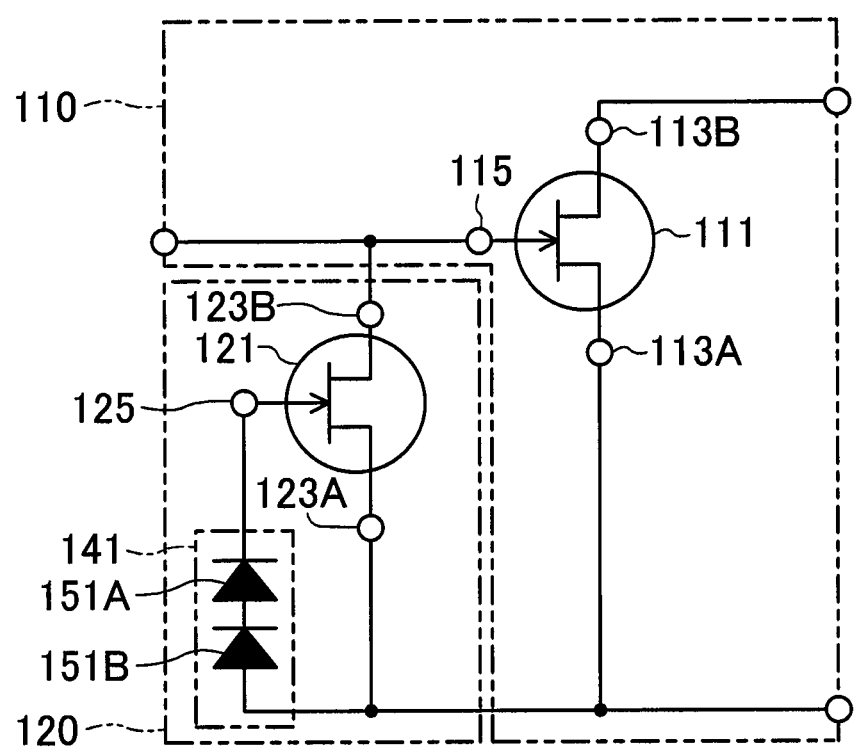
FIG. 10 is an equivalent circuit diagram of a modification of the semiconductor device of the first embodiment.

As shown in FIG. 10, the protecting element gate electrode 125 and the second protecting element ohmic electrode 123B may be connected together via a threshold voltage adjusting circuit 141. This can make the voltage that turns on the protecting element 120 to establish a current path different from the threshold voltage Vth2 of the second transistor 121.

As shown in FIG. 10, the threshold voltage adjusting circuit 141 is formed by two diodes 151A, 151B that are connected in series between the protecting element gate electrode 125 and the second protecting element ohmic electrode 123B. The diodes 151A, 151B are connected with their cathodes positioned on the protecting element gate electrode 125 side. Thus, the second transistor 121 is turned on when the voltage $V_{O2-O1}$ that is applied between the second protecting element ohmic electrode 123B and the first protecting element ohmic electrode 123A is lower than "$-(Vth2+Von\times2)$," where Von represents a turn-on voltage of the diodes 151A, 151B. For example, if Vth2 and Von are 1.5 V, the second transistor 121 is turned on to establish a current path, when $V_{O2-O1}$ is lower than −4.5 V. Note that although the voltage Von of the diode 151A is equal to that of the diode 151B in the above example, the voltage Von of the diode 151A may be different from that of the diode 151B.

If the voltage that establishes a current path is −4.5 V, a voltage that is applied to the gate electrode 115 to turn off the first transistor 111 can be about −3 V. Thus, reducing the voltage that establishes a current path can reduce the voltage that is applied to the gate electrode 115 to turn off the first transistor 111, whereby the possibility of malfunctions due to noise can be reduced.

Figure 11:
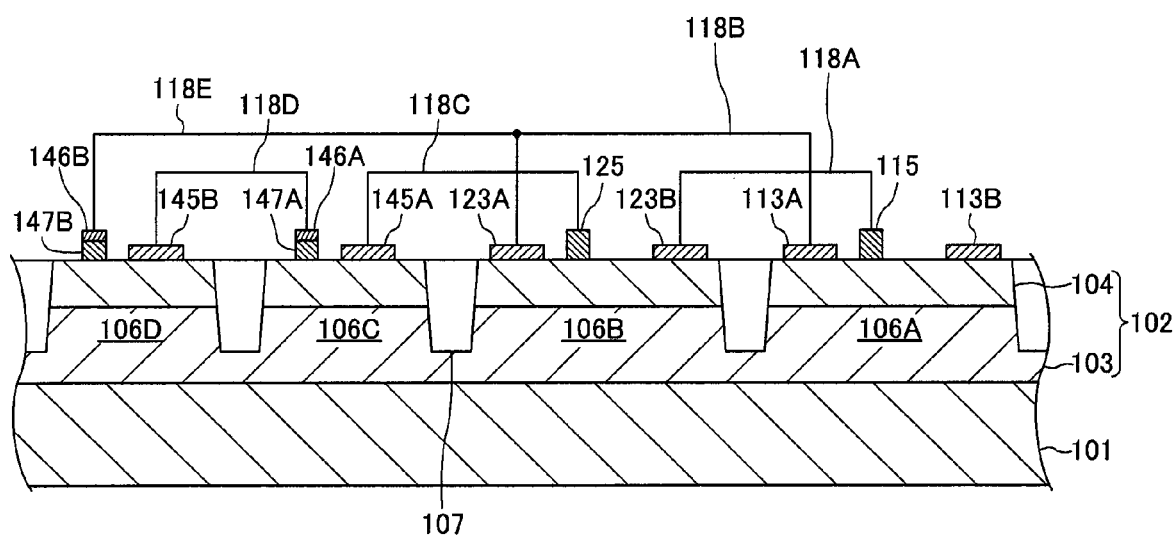
FIG. 11 is a cross-sectional view of a modification of the semiconductor device of the first embodiment.

As shown in FIG. 11, the diodes 151A, 151B can be formed over a third element region 106C and a fourth element region 106D. The diode 151A has a cathode electrode 145A formed on the third element region 106C and connected to the protecting element gate electrode 125 via a conductive interconnect 118C, and an anode electrode 146A. The diode 151B has a cathode electrode 145B formed on the fourth element region 106D and connected to the anode electrode 146A of the diode 151A via a conductive interconnect 118D, and an anode electrode 146B connected to the first protecting element ohmic electrode 123A via a conductive interconnect 118E. The anode electrodes 146A, 146B are formed on p-type semiconductor layers 147A, 147B that are made of p-type GaN or the like, respectively. The diodes 151A, 151B are pn junction diodes that use a pn junction formed by the p-type semiconductor layer and the 2DEG layer.

Figure 12:
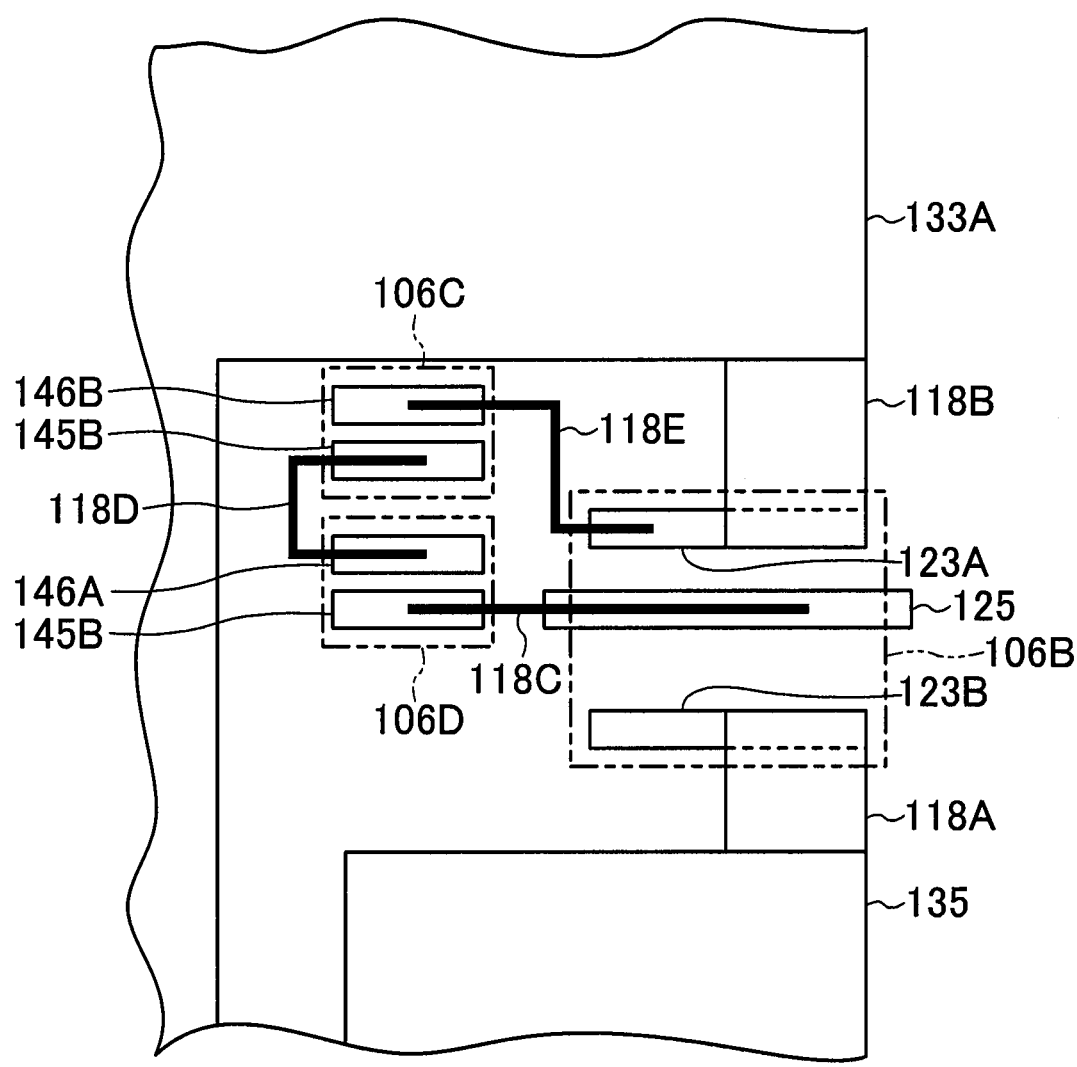
FIG. 12 is a plan view showing an example of the layout of a modification of the semiconductor device of the first embodiment.

The diodes 151A, 151B need only be able to adjust the voltage that is applied to the protecting element gate electrode 125, and thus can have low current capacity. Thus, the third and fourth element regions 106C, 106D can be smaller than the second element region 106B. Accordingly, for example, as shown in FIG. 12, the third and fourth element regions 106C, 106D can be positioned between the first ohmic electrode pad 133A and the gate electrode pad 135. Alternatively, the third and fourth element regions 106C, 106D together with the second element region 106B may be formed below the first ohmic electrode pad 133A.

The configuration in which the gate electrode 115 and the protecting element gate electrode 125 are formed on the p-type semiconductor layers may be combined with the configuration having the threshold voltage adjusting circuit 141. In this case, the p-type semiconductor layers can be formed by a common process. Alternatively, the configuration in which the gate electrode 115 and the protecting element gate electrode 125 are formed on the gate insulating films may be combined with the configuration having the threshold voltage adjusting circuit 141. Furthermore, the configuration in which the threshold voltage of the first transistor 111 is different from that of the second transistor 121 may be combined with the configuration having the threshold voltage adjusting circuit 141. For example, if the threshold voltages of the first and second transistors 111, 121 are 1.5 V and 4.5 V, respectively, and the turn-on voltages of the diodes 151A, 151B are 1.5 V, the voltage that establishes a current path by the protecting element 120 can be −7.5 V. In this case, since the gate voltage that is applied to the gate electrode 115 to turn off the first transistor 111 can be about −6 V, a large margin for noise can be provided.

Although FIGS. 10-12 show an example in which the threshold voltage adjusting circuit 141 has two diodes, the number of diodes can be determined according to the operating voltage of the protecting element 120, and may be either one, or three or more. A resistive element or the like may be connected between the threshold voltage adjusting circuit 141 and the protecting element gate electrode 125 or the first protecting element ohmic electrode 123A.

Second Embodiment

Figure 13:
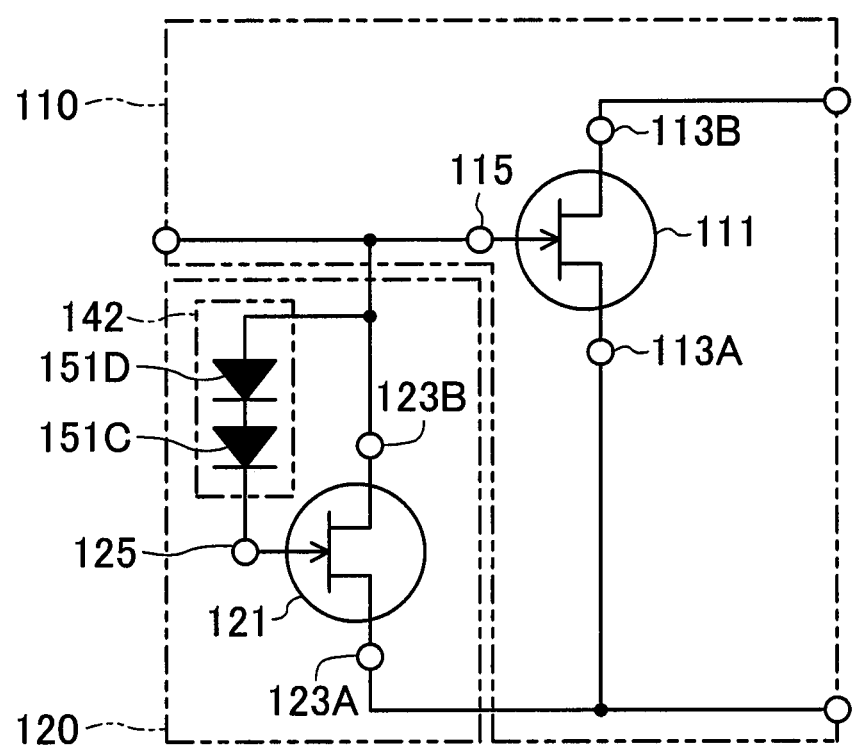
FIG. 13 is an equivalent circuit diagram of a semiconductor device according to a second embodiment.

The first embodiment is described with respect to the configuration in which the first transistor 111 is protected when a negative surge is applied to the gate electrode 115. However, the configuration of FIG. 13 can protect the first transistor 111 when a positive surge is applied to the gate electrode 115. In order to protect the first transistor 111 from positive surges, the protecting element gate electrode 125 of the second transistor 121 can be connected to the second protecting element ohmic electrode 123B via a threshold voltage adjusting circuit 142, as shown in FIG. 13.

The threshold voltage adjusting circuit 142 is formed by two diodes 151C, 151D that are connected in series between the protecting element gate electrode 125 and the second protecting element ohmic electrode 123B. The diodes 151C, 151D are connected with their cathodes positioned on the protecting element gate electrode 125 side. Thus, the second transistor 121 is turned on when the voltage $V_{O2-O1}$ that is applied between the second protecting element ohmic electrode 123B and the first protecting element ohmic electrode 123A is higher than "$Vth2+Von\times2$," where Von represents a turn-on voltage of the diodes 151C, 151D. For example, if Vth2 and Von are 1.5 V, the second transistor 121 is turned on to establish a current path, when $V_{O2-O1}$ is higher than 4.5 V. Note that although the voltage Von of the diode 151C is equal to that of the diode 151D in the above example, the voltage Von of the diode 151C may be different from that of the diode 151D.

Figure 14:
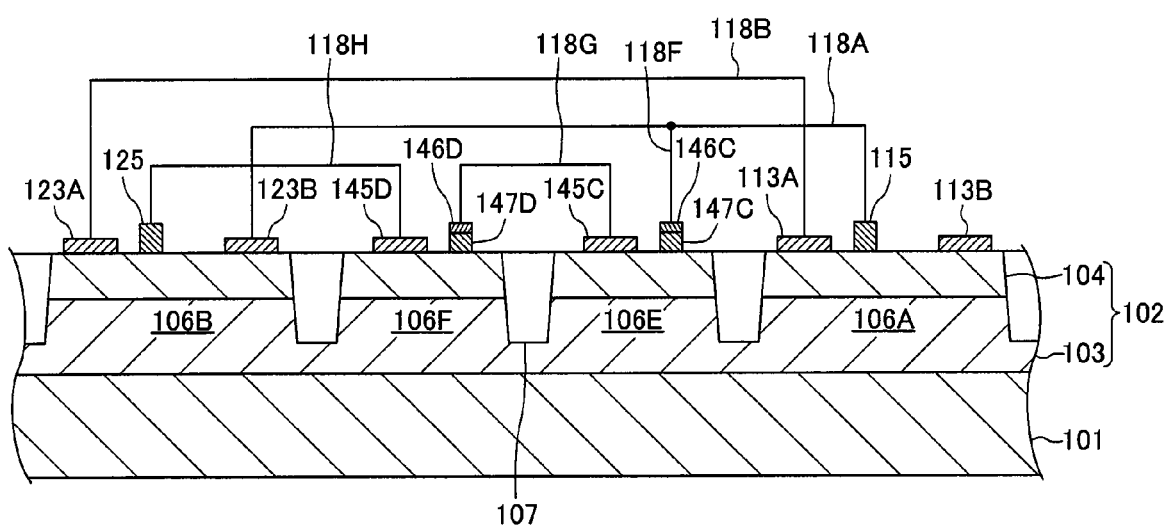
FIG. 14 is a cross-sectional view of the semiconductor device of the second embodiment.

As shown in FIG. 14, the diodes 151C, 151D can be formed over a fifth element region 106E and a sixth element region 106F. The diode 151C has a cathode electrode 145C formed on the fifth element region 106E, and an anode electrode 146C connected to the second protecting element ohmic electrode 123B via a conductive interconnect 118F. The diode 151D has a cathode electrode 145D formed on the sixth element region 106F and connected to the protecting element gate electrode 125 via a conductive interconnect 118H, and an anode electrode 146D connected to the cathode electrode 145C of the diode 151C via a conductive interconnect 118G.

The anode electrodes 146C, 146D are formed on p-type semiconductor layers 147C, 147D that are made of p-type GaN or the like, respectively. The diodes 151C, 151D are pn junction diodes that use a pn junction formed by the p-type semiconductor layer and the 2DEG layer.

The diodes 151C, 151D need only be able to adjust the voltage that is applied to the protecting element gate electrode 125, and thus can have low current capacity. Thus, the fifth and sixth element regions 106E, 106F can be smaller than the second element region 106B. Thus, the fifth and sixth element regions 106E, 106F can be positioned between the first ohmic electrode pad 133A and the gate electrode pad 135. Alternatively, the fifth and sixth element regions 106E, 106F together with the second element region 106B may be formed below the first ohmic electrode pad 133A.

The configuration in which the gate electrode 115 and the protecting element gate electrode 125 are formed on the p-type semiconductor layers may be combined with the configuration having the threshold voltage adjusting circuit 142. In this case, the p-type semiconductor layers can be formed by a common process. Alternatively, the configuration in which the gate electrode 115 and the protecting element gate electrode 125 are formed on the gate insulating films may be combined with the configuration having the threshold voltage adjusting circuit 142. Furthermore, the configuration in which the threshold voltage of the first transistor 111 is different from that of the second transistor 121 may be combined with the configuration having the threshold voltage adjusting circuit 142. For example, if the threshold voltages of the first and second transistors 111, 121 are 1.5 V and 4.5 V, respectively, and the turn-on voltages of the diodes 151C, 151D are 1.5 V, the voltage that establishes a current path by the protecting element 120 can be 7.5 V. In this case, the range of the gate voltage that is applied to the gate electrode 115 to turn on the first transistor 111 can be increased, and the gate voltage of about 3 V to 4.5 V can be applied to turn on the first transistor 111.

In the case where the threshold voltage Vth2 of the second transistor 121 is sufficiently higher than the threshold voltage Vth1 of the first transistor 111, the protecting element gate electrode 125 may be directly connected to the second protecting element ohmic electrode 123B without placing the threshold voltage adjusting circuit 142 therebetween.

Although FIGS. 13-14 show an example in which the threshold voltage adjusting circuit 142 has two diodes, the number of diodes can be determined according to the operating voltage of the protecting element 120, and may be either one, or three or more. A resistive element or the like may be connected between the threshold voltage adjusting circuit 142 and the protecting element gate electrode 125 or the second protecting element ohmic electrode 123B.

Figure 15:
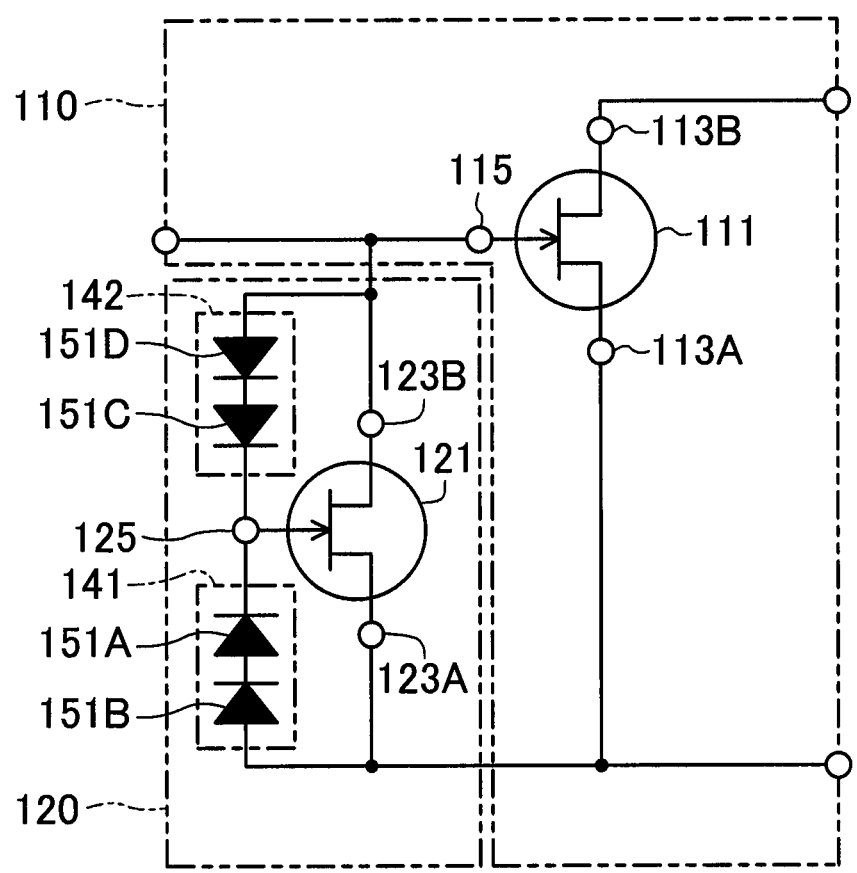
FIG. 15 is an equivalent circuit diagram of a modification of the semiconductor device of the second embodiment.
Figure 16:
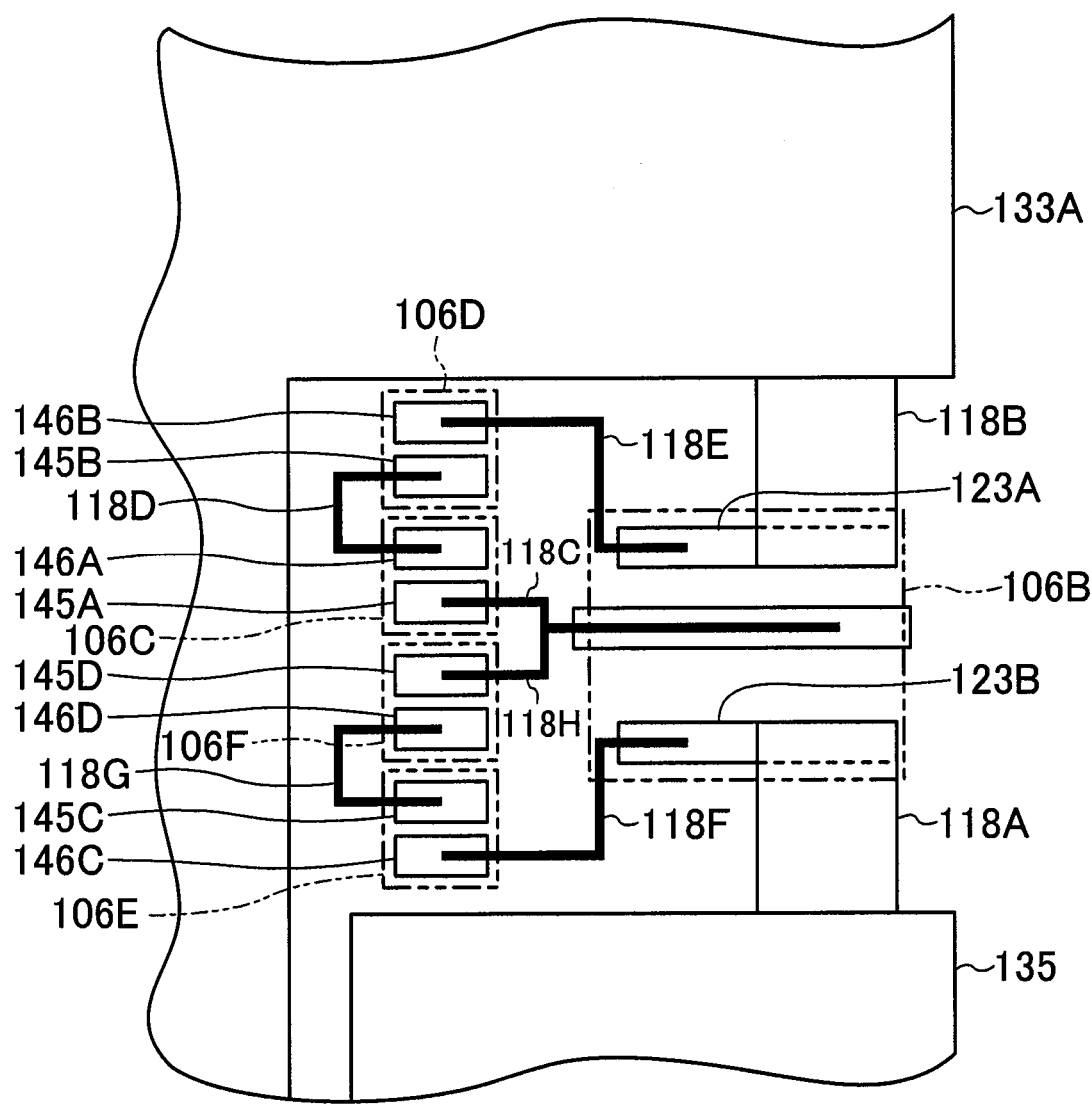
FIG. 16 is a plan view showing an example of the layout of a modification of the semiconductor device of the second embodiment.

As shown in FIG. 15, connecting the threshold voltage adjusting circuits 141, 142 between the protecting element gate electrode 125 and the first protecting element ohmic electrode 123A, and between the protecting element gate electrode 125 and the second protecting element ohmic electrode 123B, respectively, enables the first transistor 111 to be protected from both positive and negative surges. In this case, the layout can be as shown in FIG. 16. Note that although both threshold voltage adjusting circuits 141, 142 have two diodes in the above example, the number of diodes in the threshold voltage adjusting circuit 141 may be different from that of diodes in the threshold voltage adjusting circuit 142.

Third Embodiment

Figure 17:
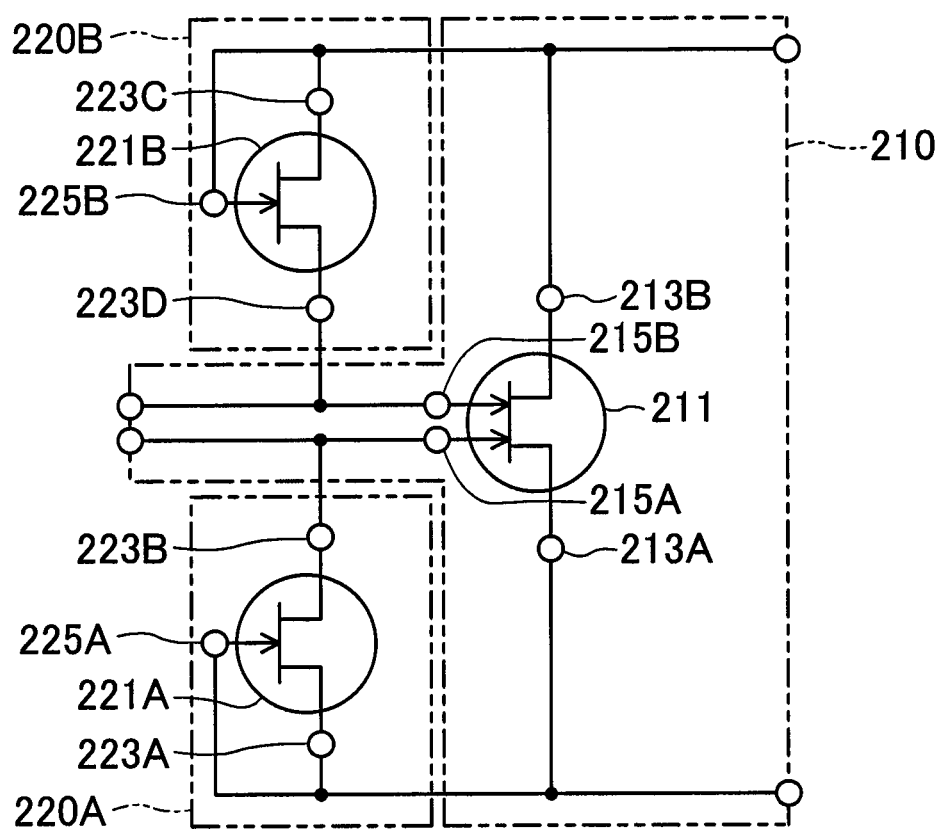
FIG. 17 is an equivalent circuit diagram of a semiconductor device according to a third embodiment.
Figure 18:
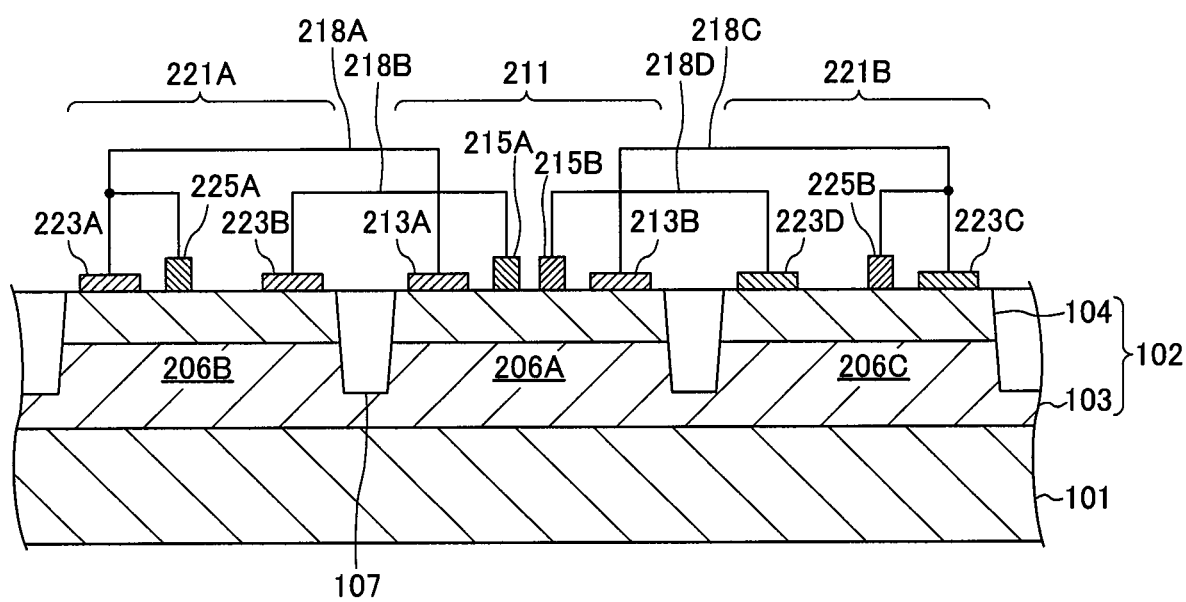
FIG. 18 is a cross-sectional view of the semiconductor device of the third embodiment.
Figure 19:
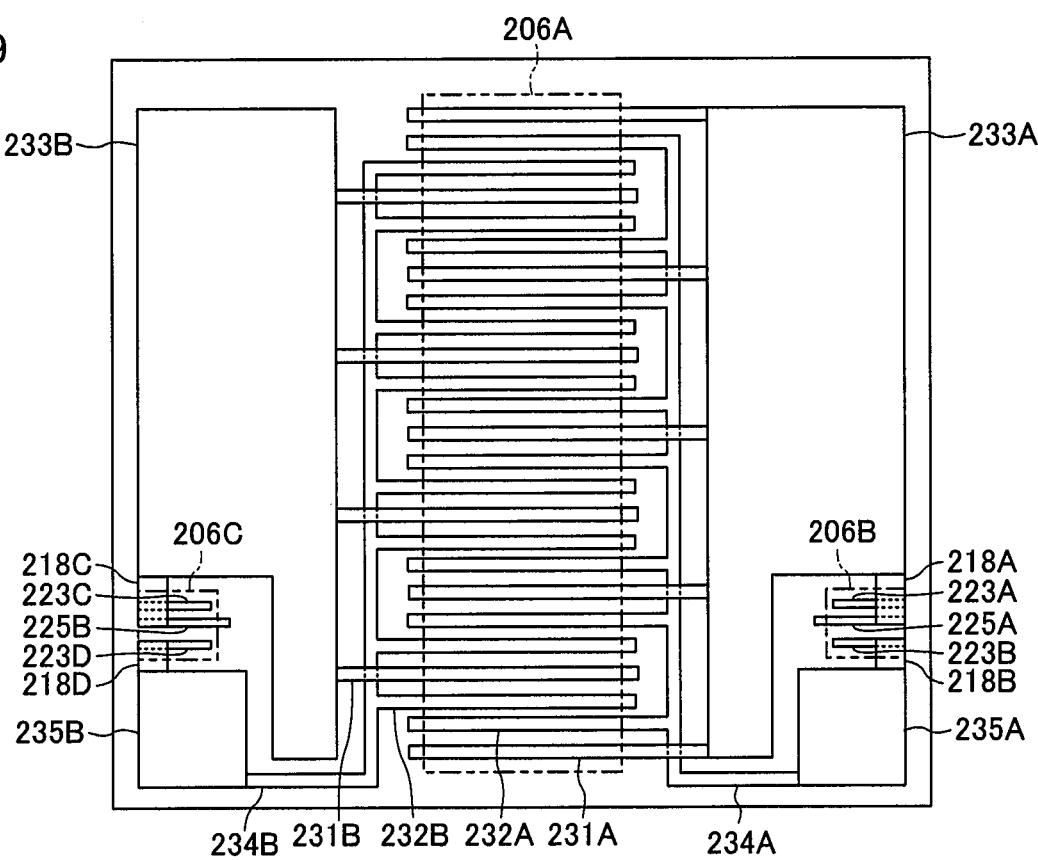
FIG. 19 is a plan view showing an example of the layout of the semiconductor device of the third embodiment.

Although the first and second embodiments are described with respect to examples of protecting a single-gate transistor, a double-gate transistor can be similarly protected. FIG. 17 shows a circuit configuration of a semiconductor device according to a third embodiment, and FIG. 18 shows a cross-sectional configuration thereof. FIG. 19 shows an example of the layout of the semiconductor device of the third embodiment. As shown in FIGS. 17-19, the semiconductor device of the present embodiment includes: a double-gate first transistor 211 having a first gate electrode 215A and a second gate electrode 215B; a first protecting element 220A, which is formed by a second transistor 221A connected between the first gate electrode 215A and a first ohmic electrode 213A of the first transistor 211; and a second protecting element 220B, which is formed by a third transistor 221B connected between the second gate electrode 215B and a second ohmic electrode 213B of the first transistor 211.

A semiconductor stack 102, which has a first semiconductor layer 103 and a second semiconductor layer 104, is formed on a substrate 101 such as a silicon (Si) substrate. The first and second semiconductor layers 103, 104 are made of GaN or the like, and are sequentially laminated on the substrate 101. The first transistor 211 is formed on a first element region 206A of the semiconductor stack 102, the second transistor 221A is formed on a second element region 206B, and the third transistor 221B is formed on a third element region 206C. The first, second, and third element regions 206A, 206B, and 206C are isolated from each other by an element isolation region 107 that is shallow trench isolation (STI) or the like.

The double-gate first transistor 211 can be operated either as a two-way switch or a diode by applying a predetermined bias to the first and second gate electrodes 215A, 215B. For example, a two-way conductive operation, namely an operation in which a current flows in both directions between the first and second ohmic electrodes 213A, 213B, can be carried out by applying to the first gate electrode 215A a voltage that is equal to or higher than the threshold voltage of the first gate electrode 215A based on the first ohmic electrode 213A, and applying to the second gate electrode 215B a voltage that is equal to or higher than the threshold voltage of the second gate electrode 215B based on the second ohmic electrode 213B. A two-way non-conductive operation, namely an operation in which no current flows in either direction between the first and second ohmic electrodes 213A, 213B, can be carried out by applying to the first gate electrode 215A a bias voltage that is lower than the threshold voltage of the first gate electrode 215A, and applying to the second gate electrode 215B a bias voltage that is lower than the threshold voltage of the second gate electrode 215B.

A diode operation, namely an operation in which a current does not flow from the first ohmic electrode 213A to the second ohmic electrode 213B, but flows from the second ohmic electrode 213B to the first ohmic electrode 213A, can be carried out by applying to the first gate electrode 215A a voltage that is equal to or higher than the threshold voltage thereof, and applying to the second gate electrode 215B a voltage that is lower than the threshold voltage thereof. Similarly, a diode operation, namely an operation in which a current flows from the first ohmic electrode 213A to the second ohmic electrode 213B, but does not flow from the second ohmic electrode 213B to the first ohmic electrode 213A, can be carried out by applying to the first gate electrode 215A a voltage that is lower than the threshold voltage thereof, and applying to the second gate electrode 215B a voltage that is equal to or higher than the threshold voltage thereof.

In the present embodiment, the first transistor 211 is a multi-finger, double-gate transistor formed on the first element region 206A of the semiconductor stack 102. The first ohmic electrode 213A has a plurality of first ohmic electrode fingers 231A, and the second ohmic electrode 213B has a plurality of second ohmic electrode fingers 231B. The first gate electrode 215A has a plurality of first gate electrode fingers 232A, and the second gate electrode 215B has a plurality of second gate electrode fingers 232B.

The first ohmic electrode fingers 231A and the second ohmic electrode fingers 231B are alternately arranged on the first element region 206A. Each pair of the first gate electrode finger 232A and the second gate electrode finger 232B is positioned between a corresponding pair of the first ohmic electrode finger 231A and the second ohmic electrode finger 231B. The first ohmic electrode fingers 231A are connected to a first ohmic electrode pad 233A, and the second ohmic electrode fingers 232A are connected to a second ohmic electrode pad 233B. The first gate electrode fingers 232A are connected to a first gate electrode pad 235A via a first gate interconnect 234A, and the second gate electrode fingers 232B are connected to a second gate electrode pad 235B via a second gate interconnect 234B.

The second and third transistors 221A, 221B are formed in the second and third element regions 206B, 206C that are smaller than the first element region 206A, respectively. The second element region 206B is formed between the first ohmic electrode pad 233A and the first gate electrode pad 235A in the semiconductor stack 102. A first protecting element ohmic electrode 223A, a first protecting element gate electrode 225A, and a second protecting element ohmic electrode 223B are formed on the second element region 206B. The first protecting element ohmic electrode 223A is connected to the first ohmic electrode pad 233A via a conductive interconnect 218A, and the second protecting element ohmic electrode 223B is connected to the first gate electrode pad 235A via a conductive interconnect 218B. The first protecting element gate electrode 225A and the first protecting element ohmic electrode 223A are connected together so as to have the same potential. The third element region 206C is formed between the second ohmic electrode pad 233B and the second gate electrode pad 235B in the semiconductor stack 102. A third protecting element ohmic electrode 223C, a second protecting element gate electrode 225B, and a fourth protecting element ohmic electrode 223D are formed on the third element region 206C. The third protecting element ohmic electrode 223C is connected to the second ohmic electrode pad 233B via a conductive interconnect 218C, and the fourth protecting element ohmic electrode 223D is connected to the second gate electrode pad 235B via a conductive interconnect 218B. The second protecting element gate electrode 225B and the fourth protecting element ohmic electrode 223D are connected together so as to have the same potential.

This configuration can protect both the first and second gate electrodes 215A, 215B of the first transistor 211 from negative surges, and enables a compact protected element and a compact protecting element to be formed. Although the sizes of the second and third element regions 206B, 206C can be determined according to required current capability, about one tenth to one fiftieth of the size of the first element region 206A is enough in typical applications. Note that the first protecting element gate electrode 225A and the first protecting element ohmic electrode 223A need only have substantially the same potential, and may be connected together via a resistor or the like. Similarly, the second protecting element gate electrode 225B and the fourth protecting element ohmic electrode 223D need only have substantially the same potential, and may be connected together via a resistor or the like.

The present embodiment may be configured so that the first ohmic electrode pad 233A covers the second element region 206B, and the second ohmic electrode pad 233B covers the third element region 206C. This can further reduce the size of the semiconductor device.

Figure 20:
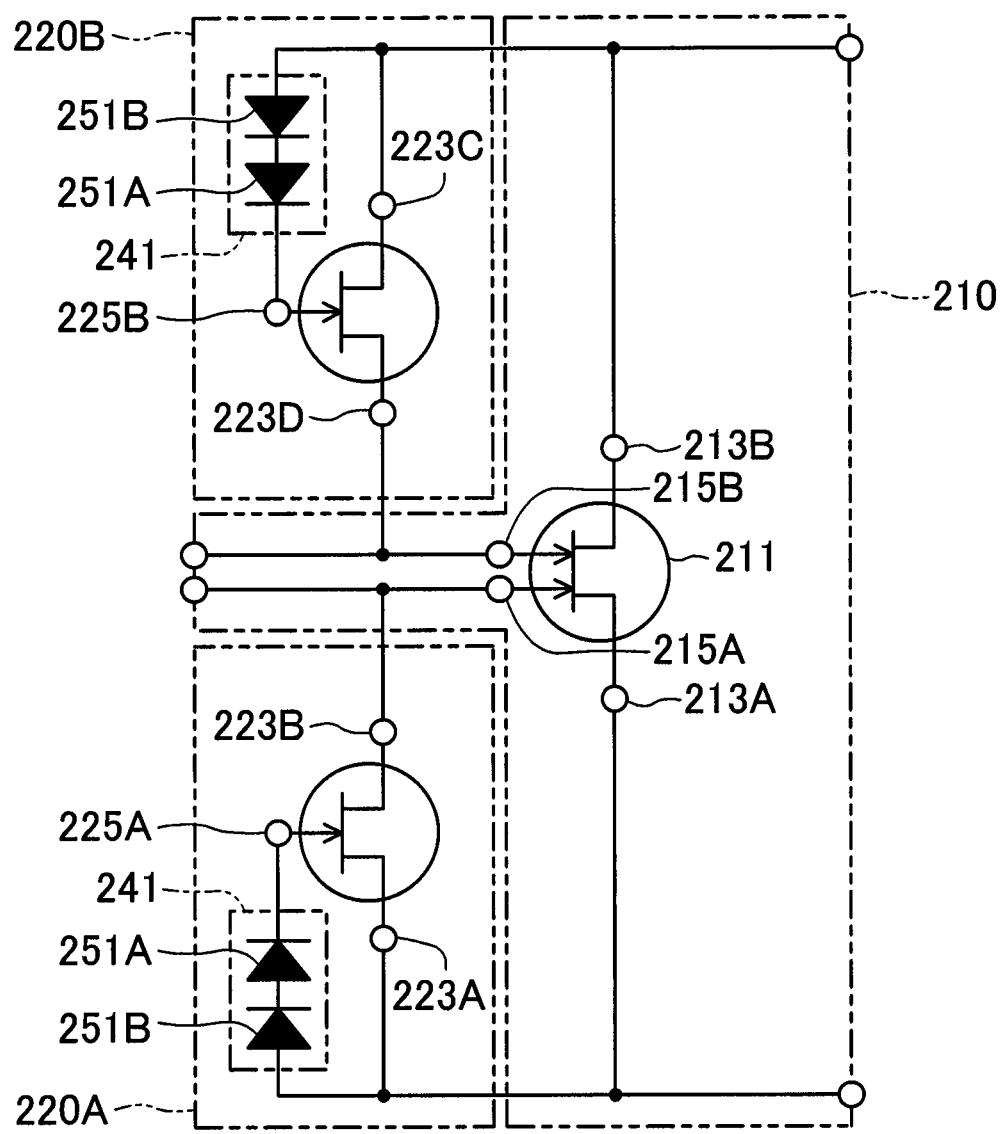
FIG. 20 is an equivalent circuit diagram of a modification of the semiconductor device of the third embodiment.

In the present embodiment as well, the first gate electrode 215A, the second gate electrode 215B, the first protecting element gate electrode 225A, and the second protecting element gate electrode 225B may be formed on the p-type semiconductor layers, and may be formed on the gate insulating films. The threshold voltage of the first gate electrode 215A may be different from that of the first protecting element gate electrode 225A, and the threshold voltage of the second gate electrode 215B may be different from that of the second protecting element gate electrode 225B. The threshold voltage of the first gate electrode 215A may be different from that of the second gate electrode 215B. As shown in FIG. 20, a threshold voltage adjusting circuit 241 having diodes 251A, 251B may be connected between the first protecting element gate electrode 225A and the first protecting element ohmic electrode 223A, and between the second protecting element gate electrode 225B and the third protecting element ohmic electrode 223C.

Figure 21:
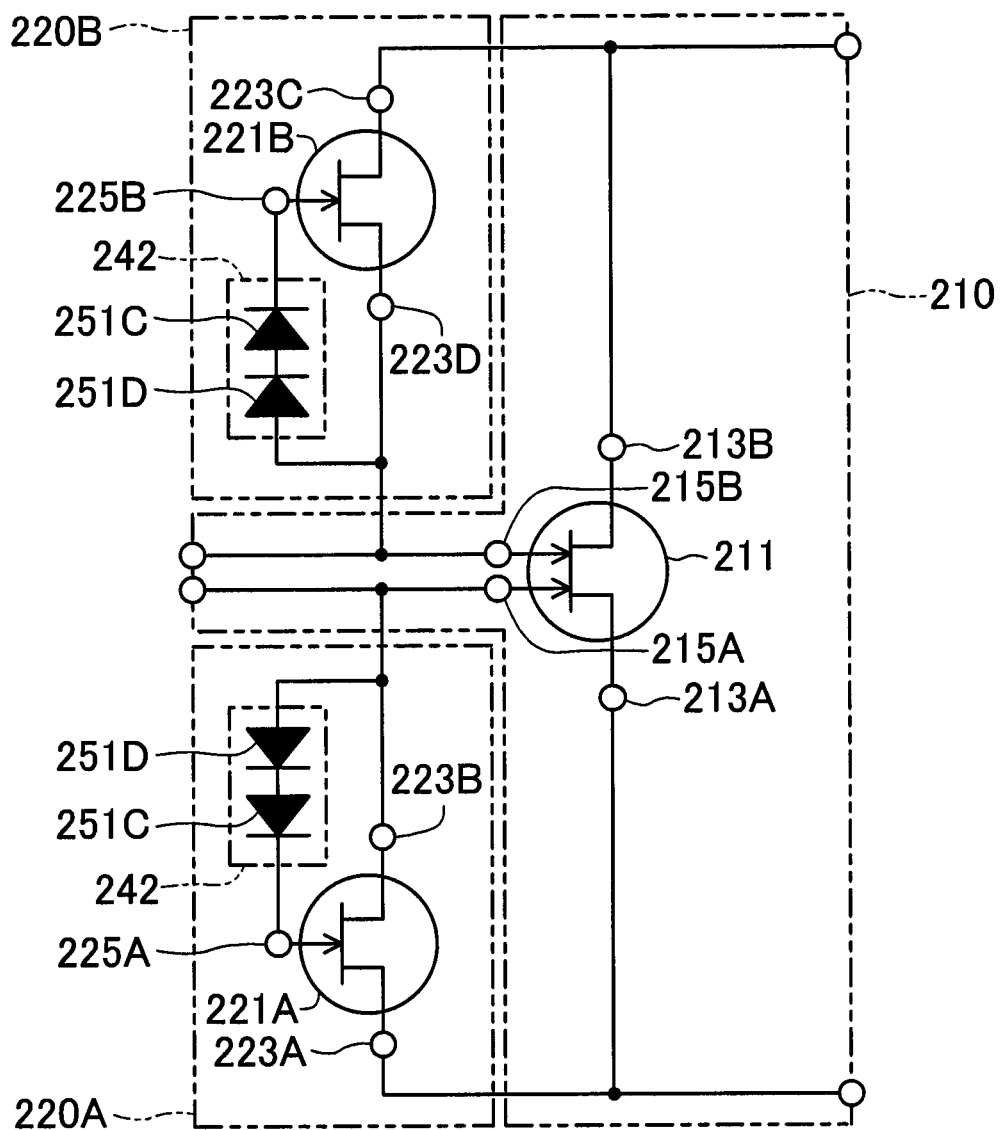
FIG. 21 is an equivalent circuit diagram of a modification of the semiconductor device of the third embodiment.
Figure 22:
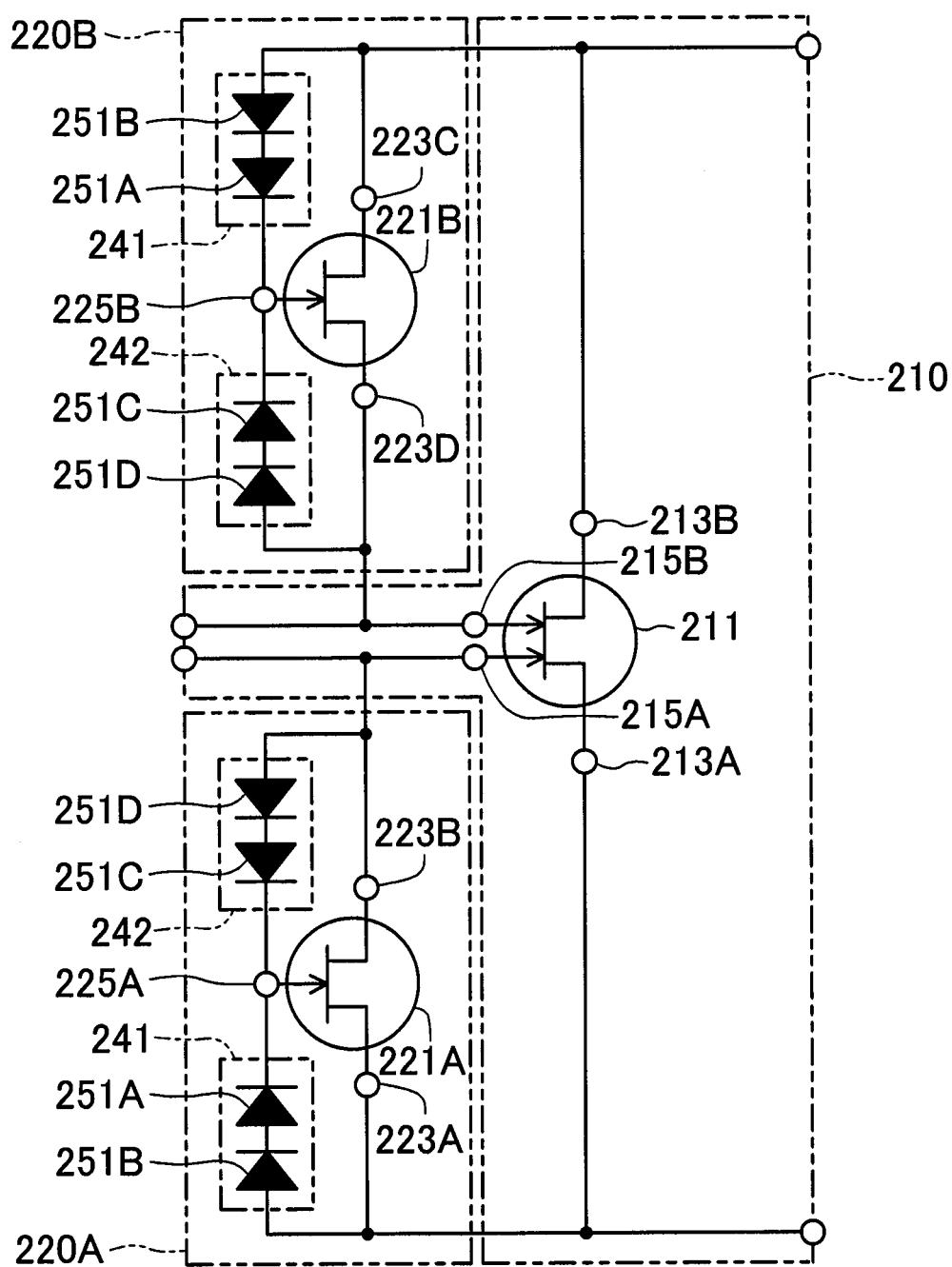
FIG. 22 is an equivalent circuit diagram of a modification of the semiconductor device of the third embodiment.

In order to protect the first transistor 211 from positive surges, as shown in FIG. 21, a threshold voltage adjusting circuit 242 having diodes 251C, 251D may be connected between the first protecting element gate electrode 225A and the second protecting element ohmic electrode 223B, and between the second protecting element gate electrode 225B and the fourth protecting element ohmic electrode 223D. In order to protect the first transistor 221 from both positive and negative surges, the threshold voltage adjusting circuits 241, 242 may be connected as shown in FIG. 22.

Note that the number of diodes in each threshold voltage adjusting circuit 241, 242 may be either one, or three or more. The number of diodes in the threshold voltage adjusting circuit 241 may be different from that of diodes in the threshold voltage adjusting circuit 242. The threshold voltage adjusting circuits 241, 242 connected to the first gate electrode 215A may have a configuration different from that of the threshold voltage adjusting circuits 241, 242 connected to the second gate electrode 215B.

Although each of the above embodiments shows an example using a Si substrate, any substrate may be used as long as nitride semiconductor layers can be formed thereon. For example, a GaN substrate, a sapphire substrate, a silicon carbide (SiC) substrate, or the like may be used.

As described above, the semiconductor device of the present disclosure is capable of implementing an HFET having high surge resistance while reducing the area of a protecting element and without complicating the manufacturing process, and is useful as a semiconductor device using nitride semiconductors and including a protecting element, and the like.

What is claimed is:
1. A semiconductor device, comprising:
a first transistor that is a heterojunction field effect transistor (HFET) having a first ohmic electrode, a first gate electrode, and a second ohmic electrode; and
a first protecting element that is connected between the first gate electrode and the first ohmic electrode, and establishes a current path that passes a current therethrough when an overvoltage is applied to the first gate electrode, wherein:
the first protecting element includes a second transistor that is a normally-off HFET having a first protecting element ohmic electrode, a first protecting element gate electrode and a second protecting element ohmic electrode, the second protecting element ohmic electrode is connected to the first gate electrode,
the first protecting element ohmic electrode is connected to the first ohmic electrode, and
the first protecting element include a first threshold voltage adjusting circuit connected between the first protecting element gate electrode and the first protecting element ohmic electrode, the first threshold voltage adjusting circuit being configured to adjust a threshold voltage of the second transistor.

2. The semiconductor device of claim 1, wherein:
the first gate electrode is formed on a first p-type semiconductor layer, and
the first protecting element gate electrode is formed on a second p-type semiconductor layer.

3. The semiconductor device of claim 2, wherein:
the first p-type semiconductor layer is formed in a first gate recess, and
the second p-type semiconductor layer is formed in a second gate recess.

4. The semiconductor device of claim 3, wherein
the second gate recess is deeper than the first gate recess.

5. The semiconductor device of claim 1, wherein
the first gate electrode is formed on a first gate insulating film, and
the first protecting element gate electrode is formed on a second gate insulating film.

6. The semiconductor device of claim 5, wherein
the second gate insulating film is thicker than the first gate insulating film.

7. The semiconductor device of claim 1, wherein
a threshold voltage of the first transistor is different from that of the second transistor.

8. The semiconductor device of claim 1, wherein
the first protecting element gate electrode has a potential equal to that of the first protecting element ohmic electrode.

9. A semiconductor device, comprising:
a first transistor that is a heterojunction field effect transistor (HFET) having a first ohmic electrode, a first gate electrode, and a second ohmic electrode; and
a second protecting element that is connected between the first gate electrode and the first ohmic electrode, and establishes a current path that passes a current therethrough when an overvoltage is applied to the first gate electrode, wherein:
the second protecting element includes a third transistor that is a normally-off transistor having a first protecting element ohmic electrode, a first protecting element gate electrode and a second protecting element ohmic electrode,
the second protecting element ohmic electrode is connected to the first gate electrode,
the first protecting element ohmic electrode is connected to the first ohmic electrode,
the second protecting element has a second threshold voltage adjusting circuit that is connected between the first protecting element gate electrode and the second protecting element ohmic electrode and is configured to adjust a threshold voltage of the third transistor.

10. The semiconductor device of claim 1, wherein:
the first protecting element includes a second threshold voltage adjusting circuit that is connected between the first protecting element gate electrode and the second protecting element ohmic electrode,
the first threshold voltage adjusting circuit includes a first diode,
the second threshold voltage adjusting circuit includes a second diode,
the first diode has a first cathode electrode connected to the first protecting element gate electrode, and a first anode electrode formed with a third p-type semiconductor layer interposed therebetween, and
the second diode has a second cathode electrode formed connected to the first protecting element gate electrode, and a second anode electrode formed with a fourth p-type semiconductor layer interposed therebetween.

11. The semiconductor device of claim 1, wherein
the first ohmic electrode has a plurality of first ohmic electrode fingers that are connected in parallel,
the second ohmic electrode has a plurality of second ohmic electrode fingers that are connected in parallel,
the first gate electrode has a plurality of first gate electrode fingers that are connected in parallel,
the first ohmic electrode fingers and the second ohmic electrode fingers are arranged alternately, and
each of the first gate electrode fingers is positioned between a corresponding pair of the first ohmic electrode finger and the second ohmic electrode finger.

12. The semiconductor device of claim 11, wherein
the first transistor has
a first ohmic electrode pad connected to the first ohmic electrode,
a second ohmic electrode pad connected to the second ohmic electrode,
a first gate electrode pad connected to the first gate electrode,
the first ohmic electrode pad is formed so as to cover the first protecting element.

13. The semiconductor device of claim 1, further comprising:
a second protecting element, wherein:
the first transistor has a second gate electrode,
the second protecting element includes a third transistor,
the third transistor has a third protecting element ohmic electrode, a second protecting element gate electrode, and a fourth protecting element ohmic electrode,
the fourth protecting element ohmic electrode is connected to the second gate electrode,
the third protecting element ohmic electrode is connected to the second ohmic electrode, and
the second protecting element gate electrode is connected to at least one of the third protecting element ohmic electrode and the fourth protecting element ohmic electrode.

14. The semiconductor device of claim 13, wherein
the first ohmic electrode has a plurality of first ohmic electrode fingers connected in parallel,
the second ohmic electrode has a plurality of second ohmic electrode fingers connected in parallel,
the first gate electrode has a plurality of first gate electrode fingers connected in parallel,
the second gate electrode has a plurality of second gate electrode fingers connected in parallel,
the first ohmic fingers and the second ohmic fingers are arranged alternately, and
each pair of the first gate electrode finger and the second gate electrode finger is positioned between a corresponding pair of the first ohmic electrode finger and the second ohmic electrode finger so that the first gate electrode finger is separated from the second gate electrode finger.

15. The semiconductor device of claim 14, wherein
the first transistor has a first ohmic electrode pad connected to the first ohmic electrode, a second ohmic electrode pad connected to the second ohmic electrode, a first gate electrode pad connected to the first gate electrode, and a second gate electrode pad connected to the second gate electrode, the first ohmic electrode pad is formed so as to cover the first protecting element, and the second ohmic electrode pad is formed so as to cover the second protecting element.

16. The semiconductor device of claim 1, wherein:

the first threshold voltage adjusting circuit includes one diode or two or more diodes connected in series in a same direction, each of the diodes including a cathode electrode and an anode electrode, the cathode electrode is directly connected to the first protecting element gate electrode, and the anode electrode is directly connected to the first protecting element ohmic electrode.

17. The semiconductor device of claim 1, wherein:

the first protecting element includes a second threshold voltage adjusting circuit, and the second threshold voltage adjusting circuit is connected between the first protecting element gate electrode and the second protecting element ohmic electrode.

18. The semiconductor device of claim 17, wherein:

the second threshold voltage adjusting circuit includes one diode or two or more diodes connected in series in a same direction, each of the diodes including a cathode electrode and an anode electrode, the cathode electrode is directly connected to the first protecting element gate electrode, and the anode electrode is directly connected to the second protecting element ohmic electrode.

* * * * *